(12) United States Patent
Belady

(10) Patent No.: US 6,285,550 B1
(45) Date of Patent: Sep. 4, 2001

(54) SUB-COOLED PROCESSOR AND COMPANION VOLTAGE REGULATOR

(75) Inventor: Christian L Belady, McKinney, TX (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/523,454

(22) Filed: Mar. 10, 2000

Related U.S. Application Data (63) Continuation-in-part of application No. 09/477,503, filed on Jan. 4, 2000.

(51) Int. Cl.$^7$ ...................................................... H05K 7/20
(52) U.S. Cl. .................... 361/704; 361/700; 361/714; 257/714; 165/104.33
(58) Field of Search ...................... 361/676, 683, 361/687–717, 813–818, 721–725, 749, 752; 165/80.2, 80.3, 80.4, 104.33, 104.14, 104.2, 185, 104.32, 104.34, 104.21; 257/706–727; 174/35 R, 16.3, 52.1, 252, 35 MS; 62/223, 259.2, 448, 332, 222, 52.1, 51.2, 62.2; 29/832, 843, 880, 835, 836, 840, 842

(56) References Cited

U.S. PATENT DOCUMENTS

| | | | |
|---|---|---|---|
| 4,009,423 | * | 2/1977 | Wilson ................................ 361/385 |
| 4,151,548 | * | 4/1979 | Klein et al. ............................. 357/82 |
| 4,392,362 | * | 7/1983 | Little .................................. 62/514 R |
| 4,697,427 | * | 10/1987 | Niggemann et al. ................... 62/119 |
| 4,938,280 | * | 7/1990 | Clark ................................... 165/80.4 |
| 5,144,531 | * | 9/1992 | Go et al. ............................... 361/382 |
| 5,199,165 | * | 4/1993 | Crawford et al. ..................... 29/846 |
| 5,365,749 | * | 11/1994 | Porter .................................. 62/259.2 |
| 5,471,850 | * | 12/1995 | Cowans ................................. 62/223 |
| 5,504,924 | * | 4/1996 | Ohashi et al. ....................... 375/800 |
| 5,544,412 | * | 8/1996 | Romero et al. ........................ 29/832 |
| 5,565,705 | * | 10/1996 | Romero et al. ...................... 257/718 |
| 5,901,040 | * | 5/1999 | Cromwell et al. ................... 361/704 |

* cited by examiner

Primary Examiner—Leo P. Picard
Assistant Examiner—Michael Datskovsky (57) ABSTRACT

A compact sub cooling method and apparatus arranged for simultaneously sub cooling both a processor and it companion voltage regulator for enhanced performance. A preferred embodiment of the invention provides for advantageous arrangement of the voltage regulator and memory proximate to the processor for high speed operation. In a preferred embodiment, a circuit board arrangement includes a processor requiring at least one bias voltage, and further includes a companion voltage regulator for providing the bias voltage. The voltage regulator is arranged sufficiently proximate to the processor, so as to limit inductance of electrical coupling therebetween. In a preferred embodiment, a piggyback design is utilized, wherein the voltage regulator is stacked on top of the processor. Furthermore, a sub cooling module is utilized to simultaneously sub cool both the processor and the voltage regulator below ambient temperature, thereby potentially enhancing the performance of both components. In a preferred embodiment, an evaporator module is sandwiched between the voltage regulator and processor, and the evaporator module interoperates with a compressor and condenser to accomplish sub cooling of the voltage regulator and processor components.

20 Claims, 2 Drawing Sheets

SUB-COOLED PROCESSOR AND COMPANION VOLTAGE REGULATOR

RELATED APPLICATIONS

This is a continuation-in-part of co-pending and commonly assigned patent application Ser. No. 09/477,503 filed Jan. 4, 2000, entitled "SUB-COOLED PROCESSOR AND COMPANION VOLTAGE REGULATOR," the disclosure of which is incorporated herein by reference.

TECHNICAL FIELD

The present invention relates in general to cooling of electronic components and in specific to a circuit board arrangement that enables simultaneously sub cooling both a processor and its companion voltage regulator.

BACKGROUND

Operation of high speed electronic components produces unwanted heat. For example, high speed computer processor components such as microprocessors, graphics processors and the like generate unwanted heat that must be removed or otherwise reduced for efficient operation. For instance, as indicated in U.S. Pat. No. 5,598,320, it is commonly known that the current generation of P5 microprocessor chips, such as Intel Corporation's Pentium® Pro microprocessor, generate a significant amount of heat during operation.

To meet ever higher requirements for computing power, designs for semiconductor modules, such as processors, continue to evolve, becoming more complex and operating at ever higher speeds. More complex designs typically integrate greater and greater numbers of transistors, which each contribute to generation of more heat during operation. As each transistor is operated at higher speeds, heat generation is further increased.

It is important to provide heat removal/reduction for such electronic components to allow for a lower operating temperature, higher operating speeds and greater computing power. If this heat is not adequately removed/reduced, the increased temperatures generated by electronic components, such as processors, can damage the components. Accordingly, it is advantageous to remove/reduce the generated heat to allow for a lower operating temperature not only to enable better performance of the electronic components but also to provide higher reliability and availability of such components.

Various circuit board arrangements and cooling schemes are known in the prior art. In discussing the prior art arrangements, the desire and importance of providing a voltage regulator (or power converter module), such as a DCDC converter, and memory in close proximity to the processor should be kept in mind. For instance, it is important to have the voltage regulator arranged in close proximity to the processor because as the voltage regulator is moved further away from the processor the inductance of the circuit increases and the capacitance supplied to the processor by the voltage regulator decreases, thereby often requiring additional components to provide such capacitance. Additionally, it is important to have memory arranged in close proximity to the processor because as memory is moved further away from the processor the latency and signal integrity for the memory is reduced such that the performance of the circuit may be negatively impacted. That is, because of the time it takes for the electrical signals to travel a relatively far distance between the memory and processor, the latency and signal integrity may be negatively effected. It will be understood that it may be advantageous to arrange other electronic components in relatively close proximity to the processor, as well.

Figures 1, 2:
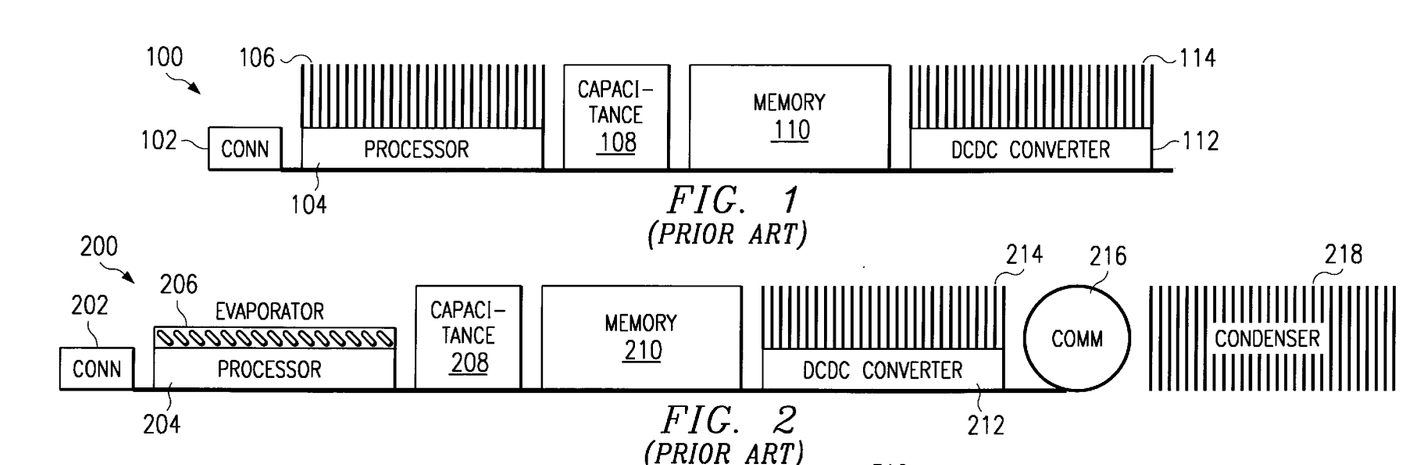
FIG. 1 illustrates a first prior art circuit board arrangement.
FIG. 2 illustrates a second prior art circuit board arrangement.

An example of one prior art arrangement/cooling scheme is illustrated in FIG. 1. FIG. 1 illustrates a traditional circuit board layout 100 comprising a connector 102 at one end of the board 100 for coupling the board 100 to, for example, a midplane or backplane, a processor 104 that is cooled with a heat sink 106, capacitance 108 to act as a power reservoir for the processor 104, memory 110, and a voltage regulator, such as DCDC converter 112 that may also be cooled with a heat sink 114. With this configuration, the DCDC converter 112 is arranged relatively far away from the processor 104, but the memory 110 is arranged in fairly close proximity to the processor 104. Because the DCDC converter 112 is arranged relatively far from the processor 104, capacitance 108 having a relatively close proximity to the processor 104 is required. Suppose, for instance, that there is a sudden need for a step load, wherein the processor is suddenly required to "work" especially hard, thus requiring a surge of power. Since the DCDC converter 112 is unable to provide the needed power surge quick enough because of its distance from the processor 104, the capacitance 108 provides the necessary surge of power by discharging its capacitors. In this configuration, memory 110 is arranged in fairly close proximity to the processor 104, although the memory-to-processor route (i.e., the distance which electrical signals are required to travel between the memory 110 and the processor 104) is slightly compromised because of the space required for the capacitance 108.

The configuration illustrated in FIG. 1 is problematic because it requires a relatively large assembly design to allow for the required components arranged in the manner illustrated thereby, and such a large design is typically costly and not easy to manufacture. Also, additional component(s) are required on the circuit board to provide local capacitance 108 adjacent to the processor 104. Separate cooling components (heat sink 106 and heat sink 114) are utilized for the processor 104 and the DCDC converter 112, thus further adding to the number of components required, thereby further increasing the cost of the circuit board. Moreover, as discussed above, the memory-to-processor route is slightly compromised because of the space required for the capacitance 108, which may negatively impact the system's performance.

FIG. 2 illustrates another example of a prior art arrangement/cooling scheme. FIG. 2 illustrates a circuit board layout 200 comprising a connector 202 at one end of the board 200 for coupling the board 200 to, for example, a midplane or backplane, a processor 204, capacitance 208 to act as a power reservoir for the processor 204, memory 210, and a voltage regulator, such as DCDC converter 212 that is cooled with a heat sink 214. In this configuration, an evaporator 206, compressor 216, and condenser 218 are utilized to perform "sub cooling" of the processor 204 (i.e., cooling the processor 204 below ambient temperature) to enhance the processor's performance (e.g., increased frequency), as is well known in the art, as opposed to the configuration of FIG. 1 wherein a heat sink is utilized to cool the processor 204 to an above-ambient temperature. With the configuration illustrated in FIG. 2, the DCDC converter 212 is again arranged relatively far away from the processor 204, but the memory 210 is arranged in fairly close proximity to the processor 204. Because the DCDC converter 212 is arranged relatively far from the processor 204, capacitance 208 having a relatively close proximity to the processor 204 is required to provide a "power reservoir," as with the configuration of FIG. 1. In this configuration, memory 210 is arranged in fairly close proximity to the processor 204, although the memory-to-processor route is slightly compromised because of the space required for the capacitance 208.

The configuration illustrated in FIG. 2 is problematic because it requires even a larger assembly design than that required for the configuration of FIG. 1 in order to allow for the additional required components arranged in the manner illustrated in FIG. 2. Such a large design is typically costly and not easy to manufacture. Also, additional component(s) are required on the circuit board to provide local capacitance 208 adjacent to the processor 204. Again, separate cooling components are utilized for the processor 204 and the DCDC converter 212, thus further adding to the number of components required, thereby further increasing the cost of the circuit board. Moreover, as discussed above, the memory-to-processor route is slightly compromised because of the space required for the capacitance 208, which may negatively impact the system's performance.

Figure 3:
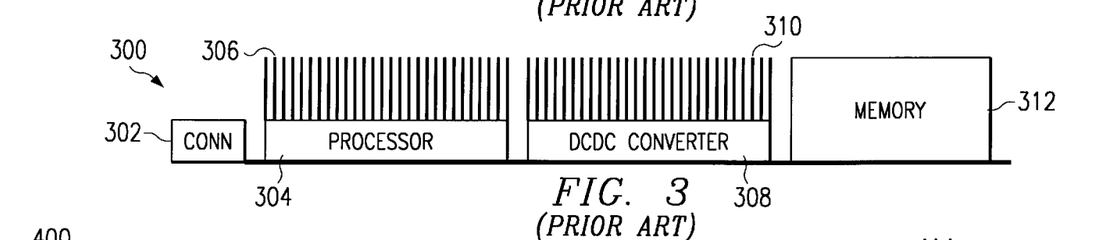
FIG. 3 illustrates a third prior art circuit board arrangement.

FIG. 3 illustrates still another example of a prior art arrangement/cooling scheme. FIG. 3 illustrates a circuit board layout 300 comprising a connector 302 at one end of the board 300 for coupling the board 300 to, for example, a midplane or backplane, a processor 304 that is cooled with a heat sink 306, a voltage regulator, such as DCDC converter 308 that may also be cooled with a heat sink 310, and memory 312. With this configuration, the DCDC converter 308 is arranged in relatively close proximity to the processor 304, but the memory 312 is arranged far away from the processor 304. Because the DCDC converter 308 is arranged relatively close to the processor 304, additional capacitance is not needed in this configuration, thereby somewhat reducing the number of components required on the circuit board. However, this configuration compromises the proximity of memory 312 to processor 304 in order to arrange the DCDC converter 308 in close proximity to the processor 304. Because memory 312 is arranged far from the processor 304, the memory-to-processor route is greatly compromised because of the space required for the DCDC converter 308, which may negatively impact latency and signal integrity.

The configuration illustrated in FIG. 3 is problematic because it requires a relatively large assembly design to allow for the required components arranged in the manner illustrated thereby, and such a large design is typically costly and not easy to manufacture. Also, separate cooling components (heat sink 306 and heat sink 310) are utilized for the processor 304 and the DCDC converter 308, thus further adding to the number of components required, thereby further increasing the cost of the circuit board. Moreover, as discussed above, the memory-to-processor route is greatly compromised because of the space required for the DCDC converter 308 between the memory 312 and the processor 304, which may negatively impact the system's performance.

Figure 4:
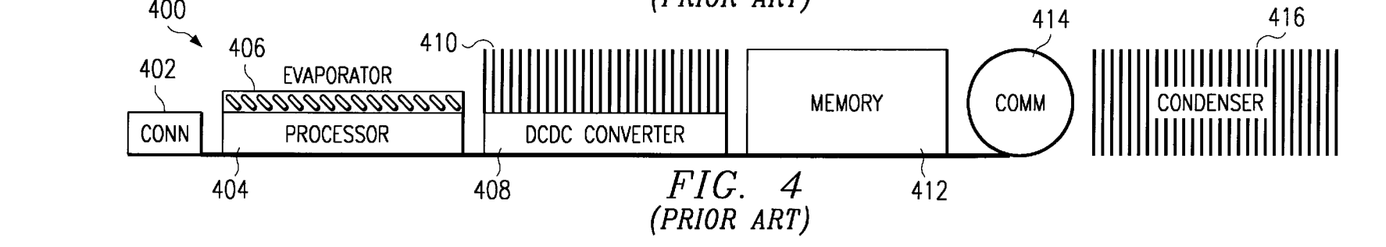
FIG. 4 illustrates a fourth prior art circuit board arrangement.

FIG. 4 illustrates yet another example of a prior art arrangement/cooling scheme. FIG. 4 illustrates a circuit board layout 400 comprising a connector 402 at one end of the board 400 for coupling the board 400 to, for example, a midplane or backplane, a processor 404, a voltage regulator, such as DCDC converter 408 that is cooled with a heat sink 410, and memory 412. In this configuration, an evaporator 406, compressor 414, and condenser 416 are utilized to perform sub cooling of the processor 404 (i.e., cooling the processor 404 below ambient temperature) to enhance the processor's performance (e.g., increased frequency), as is well known in the art, as opposed to the configuration of FIG. 3 wherein a heat sink is utilized to cool the processor 304 to an above-ambient temperature. With this configuration illustrated in FIG. 4, the DCDC converter 408 is arranged in relatively close proximity to the processor 404, but the memory 412 is arranged far away from the processor 404. Because the DCDC converter 408 is arranged relatively close to the processor 404, additional capacitance is not needed in this configuration, thereby somewhat reducing the number of components required on the circuit board. However, as with the configuration of FIG. 3, this configuration compromises the proximity of memory 412 to processor 404 in order to arrange the DCDC converter 408 in close proximity to the processor 404. Because memory 412 is arranged far from the processor 404, the memory-to-processor route is greatly compromised because of the space required for the DCDC converter 408, which may negatively impact latency and signal integrity.

The configuration illustrated in FIG. 4 is problematic because it requires a relatively large assembly design to allow for the required components arranged in the manner illustrated thereby (even larger than the configuration illustrated in FIG. 3), and such a large design is typically costly and not easy to manufacture. Also, separate cooling components are utilized for the processor 404 and the DCDC converter 408, thus further adding to the number of components required, thereby further increasing the cost of the circuit board. Moreover, as with the configuration of FIG. 3, the memory-to-processor route is greatly compromised because of the space required for the DCDC converter 408 between the memory 412 and the processor 404, which may negatively impact the system's performance.

Generally as cooling schemes of the prior art become more efficient at removing heat, the mechanisms to implement the schemes typically become larger, heavier, bulkier and more difficult to arrange in computer systems. In some processor cooling schemes of the prior art, the bulky mechanisms for implementing the schemes interfere with advantageous arrangement and placement of the companion voltage regulator and memory for highest possible operating speed. For example, such bulky mechanisms have interfered when designers have pursued a substantially co-planar arrangement of the processor and voltage regulator extending across the surface of a motherboard. This problem is exacerbated by the introduction of additional bulky mechanisms for cooling the voltage regulator.

Thus, while high speed computer systems are blessed with tremendous computing power, they are also twice cursed: first they are cursed with the demanding cooling requirement of the high speed processors; and second they are cursed with even more demanding requirements for one or more specialized companion voltage regulators and high speed memories carefully arranged proximate to the high speed processors.

SUMMARY OF THE INVENTION

In view of the deficiencies in the prior art arrangement/cooling schemes, there exists a desire for a circuit board arrangement that effectively cools the processor and the voltage regulator on the circuit board. A further desire exists for a circuit board arrangement that minimizes the number of components required on the circuit board, thereby reducing the overall size and cost of manufacturing such circuit board. Still a further desire exists for a circuit board arrangement having a compact design such that the voltage regulator and memory are arranged in relatively close proximity to the processor. Yet a further desire exists for a circuit board arrangement that allows for optimum performance of the components on the circuit board. Accordingly, a need exists for an efficient and compact cooling method and apparatus arranged for simultaneously sub cooling a processor and a voltage regulator, while still providing for advantageous arrangement of the voltage regulator and memory proximate to the processor for high speed operation.

These and other objects, features and technical advantages are achieved by an efficient and compact cooling method and apparatus arranged for simultaneously sub cooling both a processor and its companion voltage regulator below ambient temperature (e.g., room temperature), while still providing for advantageous arrangement of the companion voltage regulator and memory proximate to the processor for high speed operation.

In the past, bulky cooling mechanisms have interfered when designers have pursued a substantially co-planar arrangement of the processor and voltage regulator extending across the surface of a motherboard. In contrast, the present invention provides a compact stack arrangement of voltage regulator(s), sub cooling module (e.g., an evaporator), and processor, which enables optimum performance for high speed operation.

In order to conserve circuit board space and provide both the voltage regulator module(s) and memory module(s) in relatively close proximity to the processor, the voltage regulator can be implemented on top of the processor in a "piggy-back" design. Such a piggy-back design is disclosed in U.S. Pat. No. 5,901,040 (hereinafter "the '040 patent"), the disclosure of which is incorporated herein by reference. The '040 patent discloses a piggy-back design for a power converter module (e.g., a voltage regulator) and a semiconductor module (e.g., a processor), which utilizes a passive heat sink assembly to remove heat from the power converter and semiconductor modules. The '040 patent discloses an embodiment wherein a heat transfer layer is sandwiched between the semiconductor and power converter modules. The '040 patent discloses that the heat sink utilized for removing heat from the power converter and semiconductor modules may include a heat transfer layer, a fin stack, and a series of heat pipes.

Figure 5:
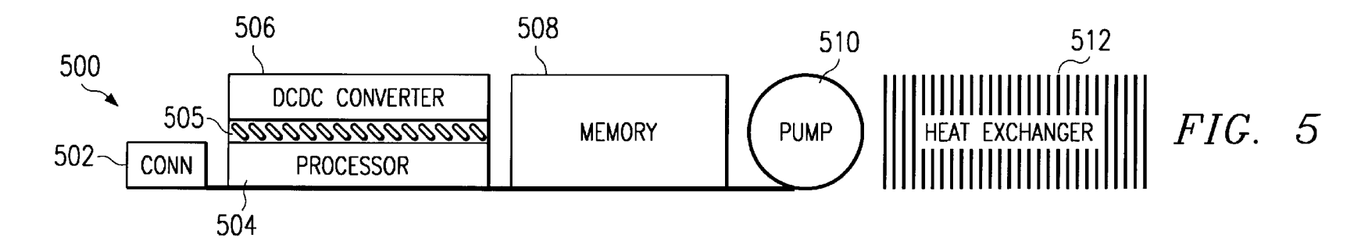
FIG. 5 illustrates an exemplary circuit board arrangement that utilizes liquid cooling to simultaneously draw heat from the voltage regulator and processor, as disclosed in co-pending patent application Ser. No. 09/240,266.

Because a desire existed to further reduce the overall amount of space required for a circuit board, including the space above the processor contained thereon, U.S. patent application Ser. No. 09/240,266 (hereinafter "the '266 application") discloses a further cooling implementation utilizing the piggy-back design. The '266 application implements liquid cooling, in which a pump provides liquid cooling to a low profile cold plate that is sandwiched between the processor and voltage regulator. More specifically, an example of the configuration disclosed in the '266 application is shown in FIG. 5. FIG. 5 illustrates a circuit board layout 500 comprising a connector 502 at one end of the board 500 for coupling the board 500 to, for example, a midplane or backplane, a processor 504, a voltage regulator, such as DCDC converter 506, and memory 508. With this configuration, the piggy-back design advantageously allows both the DCDC converter 506 and the memory 508 to be arranged in close proximity to the processor 504. Furthermore, a low profile cold plate is sandwiched between the DCDC converter 506 and processor 504 to draw heat from both components simultaneously. Liquid cooling is utilized in this configuration, wherein a heat exchanger 512 is thermally coupled in fluid communication with the cold plate 505 for drawing heat therefrom. The cold plate 505 and heat exchanger 512 each include respective flow paths (e.g., pipes) therethrough for circulating a cooling fluid, for example, water, ethylene glycol mixed with water, fluorinerts, or other suitable fluids known to those with ordinary skill in the art. A pump 510 is coupled in line with the heat exchanger 512 and cold plate 505 to promote circulation of the cooling fluid. Thus, the pump 510 causes cooling fluid to be circulated from the heat exchanger 512 through the cold plate 505 and back to the heat exchanger 512, thereby drawing heat from the processor 504 and DCDC converter 506 simultaneously.

While the configurations disclosed in the '040 patent and '266 application provide many advantages over the prior art configurations, including providing a compact design that results in improved performance, the cooling schemes disclosed in the '040 patent and '266 application do not cool the processor and voltage regulator below ambient temperatures. Thus, a configuration that expands upon the advances achieved in the '040 patent and '266 application by sub cooling the processor and voltage regulator below ambient temperatures is desirable because such sub cooling permits the processor and voltage regulator to achieve even greater performance. For example, sub cooling a processor results in enhanced performance of the processor (e.g., increased operating speed of the processor). As a further example, sub cooling the voltage regulator results in an enhanced current capacity of such voltage regulator.

A preferred embodiment of the present invention utilizes the "piggy-back design", as disclosed in the '266 application and the '040 patent, and implements a sub cooling module within such piggy-back design to simultaneously sub cool the voltage regulator and the processor. In a preferred embodiment, a processor requiring at least one bias voltage is electrically coupled to a voltage regulator for providing the at least one bias voltage. The processor and voltage regulator are stacked in a piggy-back design, and at least one sub cooling module (e.g., an evaporator) is implemented between the processor and the voltage regulator to actively sub cool the processor and voltage regulator simultaneously. In a preferred embodiment, an evaporator/condenser/compressor assembly is implemented to accomplish such sub cooling. Such an assembly for performing sub cooling is well known in the art and has been utilized in prior art configurations to cool a processor (see FIGS. 2 and 4, as discussed above). It should be understood, however, that any sub cooling assembly now known or later developed may be implemented to simultaneously sub cool the processor and its companion voltage regulator, and any such implementation is intended to be within the scope of the present invention.

It should be appreciated that a technical advantage of one aspect of the present invention is that an arrangement for a circuit board is provided that is significantly more compact than boards implementing prior art arrangement schemes. In a preferred embodiment, an evaporator, which is generally significantly more compact than a heat sink, is utilized to sub cool the processor and voltage regulator. Because the board is compact, costs for manufacturing the board will typically be reduced. A further technical advantage of one aspect of the present invention is that an arrangement for a circuit board is provided that utilizes a dense, three-dimensional design (as opposed to a completely co-planar design) which enables the voltage regulator and memory (and/or other critical electronic components) to be arranged adjacent to the processor. Thus, both the voltage regulator and memory/other critical electronic components are arranged in close proximity to the processor, which minimizes the routing length to the memory/other critical electronic components and minimizes the inductance of the voltage regulator.

A further technical advantage of one aspect of the present invention is that both the processor and its companion voltage regulator are sub cooled simultaneously. The lower operating temperatures achieved by sub cooling increases the reliability and availability of the processor and voltage regulator components. Still a further technical advantage of one aspect of the present invention is that sub cooling the processor allows for enhanced performance. For instance, sub cooling a processor to approximately minus forty degrees Centigrade (−40 C.) can result in approximately 33% increase in speed. Yet a further technical advantage of one aspect of the present invention is that sub cooling the voltage can enhance the current capacity of such voltage regulator, which allows smaller voltage regulator components to be implemented within the circuit board thus further compacting the circuit board design. Thus, by providing a design that arranges both the voltage regulator and memory (or other electronic components) in close proximity to the processor and simultaneously sub cools the processor and voltage regulator, optimum performance can be achieved, while allowing for a small, compact assembly.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 6:
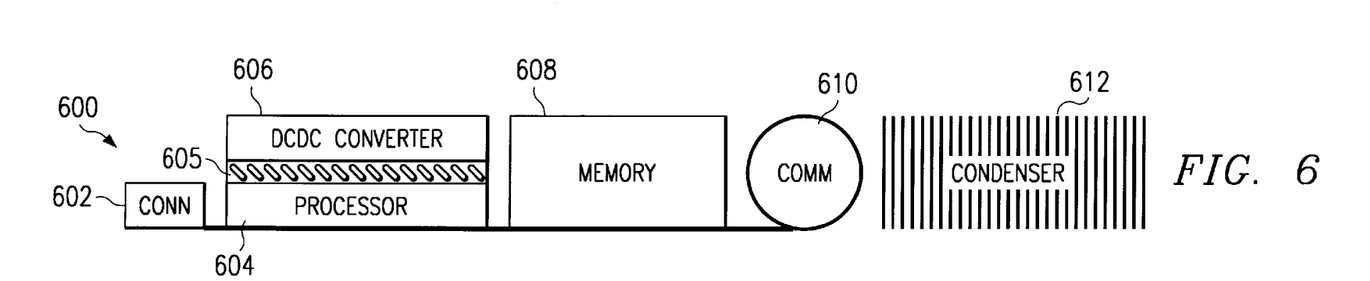
FIG. 6 illustrates an exemplary circuit board arrangement of a preferred embodiment of the present invention that simultaneously sub cools the voltage regulator and processor.

FIG. 6 illustrates a circuit board arrangement 600 for a preferred embodiment of the present invention. Circuit board layout 600 comprises a connector 602 at one end of the board 600 for coupling the board 600 to, for example, a midplane or backplane, a processor 604, a voltage regulator, such as DCDC converter 606, and memory 608. With this configuration, a piggy-back design is utilized wherein the voltage regulator 606 and processor 604 are stacked. Such a piggy-back design advantageously allows both the voltage regulator 606 and the memory 608 (and/or other critical electronic components) to be arranged in close proximity to the processor 604. Furthermore, a sub cooling module, such as an evaporator 605, is sandwiched between the voltage regulator 606 and processor 604 to actively sub cool both components simultaneously below ambient temperature.

In a preferred embodiment, as shown in FIG. 6, an evaporator 605, compressor 610, and condenser 612 are utilized to accomplish sub cooling, as is well known in the art. Generally, compressor 610 circulates, as well as compresses, the refrigerant gas (high pressure). The refrigerant gas condenses in the condenser 612 (as it gives off heat) resulting in a high-pressure liquid. The high-pressure liquid is then expanded through a valve and evaporated to absorb heat in the evaporator 605, thus performing sub-cooling. The sub-cooled gas is then recompressed by the compressor 610 and the cycle continues. It should be understood, of course, that any sub cooling system now known or later developed may be implemented in a similar manner, and any such implementation is intended to be within the scope of the present invention.

The arrangement of FIG. 6 utilizing sub cooling offers many advantages. For example, sub cooling reduces the temperature for both the voltage regulator and the processor below ambient temperature. For instance, the voltage regulator and processor may be sub cooled to a temperature of approximately minus forty degrees Centigrade (−40 C.). Sub cooling the processor and voltage regulator below ambient temperature is desirable because such sub cooling permits the processor and voltage regulator to achieve enhanced performance. For example, sub cooling the processor significantly enhances the processor's speed. For instance, sub cooling a processor to approximately minus 40 degrees Centigrade (−40 C.) can potentially increase a processor's speed by approximately thirty-three percent (33%). Similarly, sub cooling the voltage regulator can significantly enhance the per unit volume current capacity for such voltage regulator(s). For example, isothermal research has demonstrated that a 50 C. decrease in the voltage regulator temperature can enhance the per unit volume current capacity for such voltage regulator by more than a factor of two. Furthermore, in a preferred embodiment, the circuit board is hot swappable, which allows the system to continue operating as this whole assembly is connected and disconnected (e.g., via connector 602). Moreover, in a preferred embodiment, the condenser 612, evaporator 605, and compressor 610 are all embodied within the circuit board, such that the board is not required to be coupled to sub-cooling components off the board, thereby reducing the possibility of leakages.

Figure 7:
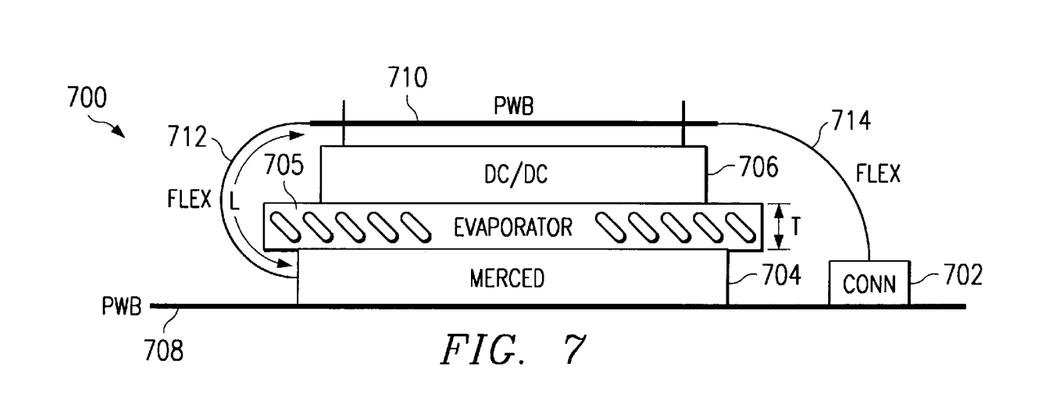
FIG. 7 illustrates an exemplary implementation of the stacked voltage regulator and processor on a circuit board, wherein the voltage regulator and processor are simultaneously sub cooled.

FIG. 7 illustrates an exemplary implementation of a preferred embodiment for circuit board 700. As shown, the configuration includes a processor 704 requiring at least one bias voltage, and further includes a companion voltage regulator 706 for providing the at least one bias voltage. An evaporator 705 is sandwiched between the processor 704 and the voltage regulator 705. As explained above, the evaporator 706 functions, along with a compressor and condenser (not shown in FIG. 7) to perform sub cooling for the processor and the voltage regulator simultaneously. In the exemplary implementation shown in FIG. 7, the processor 704 is a Merced Processor, although it should be understood that any processor now known or later developed may be so implemented. Electrical coupling 712 between the voltage regulator 706 and the processor 704 conducts the bias voltages thereto. Preferably, the electrical coupling 712 includes a strip of single or multilayer polymide (or polyester) based flexible printed circuit material. There are some trade-offs to be made: although multilayer strips may provide a desirable lower inductance, they are generally more expensive than single layer strips.

A source voltage is provided to the voltage regulator 706 from a supportive printed wiring board 708 through another electrical coupling 714, preferably also of the flexible printed circuit material. A square fixture of printed wiring board 710 is soldered to the voltage regulator 706 and to each of the electrical couplings 712, 714 of flexible printed circuit material, so as to provide secure electrical connection thereto. Alternatively, a so called "flying lead" may be used for connecting said another electrical coupling 714. It should be understood that additional alternative arrangements may also be used with beneficial results. For example, the invention may be practiced using a so called "power pod," which provides an integral arrangement of the voltage regulator and electrical couplings, along with any needed fixturing.

In a preferred embodiment, the source voltage is forty eight volts DC (Direct Current), which is adapted by the voltage regulator to provide a selected bias voltage, typically two volts or less. It should be understood that although in some designs, a bias voltage of two volts is preferred, the principles of the invention are not limited to a particular bias voltage (or a particular source voltage).

In a most preferred embodiment, the circuit board is a hot swappable module that includes the evaporator, condenser and compressor thereon. Accordingly, in a most preferred embodiment external couplings are not required for the board between the sub cooling components, which reduces the potential for leakages. Although, it should be understood that in alternative embodiments some of the sub cooling components may be located off the circuit board and be coupled to the board to allow sub cooling.

A packaging problem in the industry is containing electromagnetic (EMI) or radio frequency (RFI) disturbances. Hereinafter, EMI and RFI disturbances will be referred to as "EMI." Semiconductor modules (e.g., processors) and power converter modules (e.g., voltage regulators) generate EMI, which must be shielded and reduced. To shield against EMI, the voltage regulator and processor may be packaged in a single EMI container (e.g., a Faraday Cage), that provides EMI shielding while maintaining a compact design. An example of a compact Faraday Cage design that provides EMI shielding is disclosed in U.S. Pat. No. 5,901,040, which is incorporated herein by reference.

In a preferred embodiment, memory module(s) 608 (not shown in FIG. 7) and processor 604 are each soldered or otherwise electrically coupled with conductive traces of the printed wiring board 708, to provide for electrical coupling between the memory and the processor and for conducting electrical signals therebetween. As illustrated in FIG. 6, in a preferred embodiment the memory 608 is arranged sufficiently proximate to the processor, so as to limit propagation delay of the signals through the electrical coupling. In the preferred embodiment, each of the conductive traces providing electrical coupling between the processor controller and a respective memory controller of each memory module is substantially less than approximately forty-three centimeters (43 cm) in order to provide for memory access frequency of approximately one-hundred-and-twenty-five Megahertz (125 MHz) or higher. To provide for an adequate timing margin for such a high memory access frequency, it is preferred that each of the conductive traces providing electrical coupling between the processor controller and a respective memory controller of each memory module is within approximately thirty-eight centimeters.

The voltage regulator 706 is arranged sufficiently proximate to the processor 704, so as to limit inductance of the electrical coupling 712 therebetween. It should be understood that the electrical coupling 712 may engage the processor 704 as shown in FIG. 7, or alternatively may be connected to the printed wiring board 708 at a location directly adjacent to the processor, and in turn coupled with the processor 704 through relatively short conductive traces created for the printed wiring board 708. A length dimension, L, of the electrical coupling 712 extending from the processor through where the square fixture of printed wiring board 710 is soldered to the voltage regulator 706 is within a range of approximately two millimeters to approximately twenty-five millimeters, so as to limit inductance of the electrical coupling 712 and so as to provide for a suitable step load current response for when the processor is operating at clock frequencies within a range of approximately one Gigahertz (or higher) down to approximately two-hundred-forty Megahertz. In a most preferred embodiment, the length of the electrical coupling between the voltage regulator and the processor is less than 1 inch, so as to provide for suitable step load current response for when the processor is operating at clock frequencies of five-hundred Megahertz or more.

Accordingly, the proximate arrangement of the voltage regulator 706 with the processor 704 is within a range of approximately two millimeters to approximately twenty-five-millimeters. In a most preferred embodiment, the proximate arrangement of the voltage regulator 706 with the processor 704 is less than 1 inch.

For the same reasons just discussed, the inductance of the electrical coupling between the voltage regulator and the processor is within a range of approximately point-one-five (0.15) nanohenries (for the one Gigahertz clock frequency) to approximately point-six (0.6) nanohenries (for the two-hundred-forty Megahertz clock frequency). In a preferred embodiment, the inductance of the electrical coupling between the voltage regulator and the processor is approximately point-three (0.3) nanohenries (corresponding to the five-hundred Megahertz clock frequency).

A total thickness dimension, T, of the evaporator 705 sandwiched between the voltage regulator 706 and processor 704 is sufficiently thin so as to provide for the proximate arrangement of the voltage regulator 706 with the processor 704. In a preferred embodiment, the total thickness of the evaporator 705 is within a range of approximately two (2) millimeters to approximately seven (7) millimeters.

As discussed, a preferred embodiment of the present invention provides an efficient and compact sub cooling method and apparatus arranged for simultaneously sub cooling both a processor and a voltage regulator, while still providing for advantageous arrangement of the voltage regulator and memory (and/or other critical electronic components) proximate to the processor for high speed operation. While the above discussion of a preferred embodiment discloses a piggy-back design for a processor and its companion voltage regulator, it should be understood that any type of semiconductor module that requires power from an associated power supply module. Accordingly, the present invention is not intended to be limited to implementing a processor and voltage regulator on a circuit board in accordance with the arrangement disclosed herein, but instead the scope of the present invention is intended to encompass a circuit board having any semiconductor module now known or later developed that requires an associated power supply, which are arranged in accordance with the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising;
   a semiconductor module requiring at least one bias voltage;
   a companion power supply module for providing the at least one bias voltage;
   electrical coupling between the power supply module and the semiconductor module for conducting the at least one bias voltage thereto;
   at least one sub cooling module between the semiconductor module and the power supply module arranged to simultaneously sub cool the semiconductor module and the power supply module below ambient temperature;
   a condenser module; and
   a compressor module;
   wherein said semiconductor module, said companion power supply, said at least one sub cooling module, said condenser module, and said compressor module are included on a circuit board.

2. An apparatus as in claim 1, wherein there is sufficiently proximate arrangement of the power supply module with the semiconductor module, so as to limit inductance of the electrical coupling therebetween.

3. An apparatus as in claim 2, wherein the proximate arrangement of the power supply module with the semiconductor module is within the range of approximately two millimeters to approximately twenty-five millimeters.

4. An apparatus as in claim 1, wherein the sub cooling module actively sub cools the semiconductor module and the power supply module to a temperature below approximately 20 degrees Centigrade (20 C.).

5. An apparatus as in claim 1, wherein the sub cooling module actively sub cools the semiconductor module and the power supply module to temperatures within a range of approximately 20 degrees Centigrade (20 C.) to approximately minus 40 degrees Centigrade (−40 C.).

6. An apparatus as in claim 1, wherein:
   the apparatus further comprises a memory module;
   electrical coupling between the memory module and the semiconductor module for conducting signals therebetween; and
   wherein there is a sufficiently proximate arrangement of the memory module with the semiconductor module, so as to limit propagation delay of the signals through the electrical coupling.

7. An apparatus as in claim 6, wherein the proximate arrangement of the memory module with the semiconductor module is substantially less than approximately forty centimeters.

8. An apparatus as in claim 7, wherein the proximate arrangement of the memory module with the semiconductor module is within approximately thirty-eight centimeters.

9. An apparatus as in claim 1, wherein the semiconductor module is a processor, the companion power supply module is a companion voltage regulator, and the sub cooling module is an evaporator.

10. A method of providing a sub cooled semiconductor module and companion power supply module that minimizes space required on a circuit board, the method comprising:
    providing a semiconductor module, a companion power supply module, and electrical coupling for conducting voltage therebetween on said circuit board;
    sandwiching an evaporator between the semiconductor module and the power supply module;
    providing a condenser and a compressor on said circuit board, wherein said semiconductor module, power supply module, evaporator, condenser, and compressor are included on said circuit board; and
    using the evaporator to simultaneously sub cool the semiconductor module and the power supply module to a temperature below the ambient temperature of the semiconductor module and power supply module.

11. A method as in claim 10, wherein the semiconductor module is a processor and the power supply module is a voltage regulator.

12. A method as in claim 10, further comprising:
    providing a memory module and electrical coupling between the memory module and the semiconductor module for conducting signals therebetween; and
    arranging of the memory module sufficiently proximate to the semiconductor module, so as to limit propagation delay of the signals through the electrical coupling.

13. A computer system comprising:
    a circuit board;
    a processor;
    a companion voltage regulator electrically coupled to said processor with electrical coupling therebetween, wherein the companion voltage regulator provides electrical power to the processor;
    at least one evaporator sandwiched between the processor and the companion voltage regulator to actively sub cool the processor and companion voltage regulator simultaneously;
    a condenser; and
    a compressor;
    wherein the condenser and compressor interoperate with the evaporator to achieve sub cooling of the processor and voltage regulator;
    wherein said processor, at least one evaporator, companion voltage regulator, condenser, and compressor are included on said circuit board.

14. A computer system as in claim 13, wherein said at least one evaporator simultaneously maintains the processor and the companion voltage regulator at a temperature below approximately 20 degrees Centigrade (20 C.).

15. A computer system as in claim 13, wherein said circuit board is hot swappable within the computer system.

16. The computer system of claim 13 wherein said at least one evaporator simultaneously maintains the processor and the companion voltage regulator at a temperature with a range of approximately 20 degrees Centigrade (20 C.) to approximately minus 40 degrees Centigrade (−40 C.).

17. The computer system of claim 13 further comprising:

a memory module included on said circuit board;

electrical coupling between the memory module and the processor for conducting signals therebetween; and wherein there is a sufficiently proximate arrangement of the memory module with the processor, so as to limit propagation delay of the signals through the electrical coupling.

18. The computer system of claim 17 wherein the sufficiently proximate arrangement of the memory module and the processor is substantially less than forty centimeters.

19. The apparatus of claim 1 wherein the circuit board is hot swappable within a computer system.

20. The method of claim 13 wherein said circuit board is hot swappable within a computer system.

* * * * *

UNITED STATES PATENT AND TRADEMARK OFFICE
CERTIFICATE OF CORRECTION

PATENT NO.     : 6,285,550 B1
DATED          : September 4, 2001
INVENTOR(S)    : Belady Page 1 of 1

It is certified that error appears in the above-identified patent and that said Letters Patent is hereby corrected as shown below:

<u>Column 14,</u>
Line 10, delete "claim 13" and insert therefor -- claim 10 --.

Signed and Sealed this

Eighth Day of June, 2004

JON W. DUDAS
*Acting Director of the United States Patent and Trademark Office*